United States Patent
Zimlich

(10) Patent No.: US 7,084,686 B2
(45) Date of Patent: Aug. 1, 2006

(54) SYSTEM AND METHOD FOR OPEN-LOOP SYNTHESIS OF OUTPUT CLOCK SIGNALS HAVING A SELECTED PHASE RELATIVE TO AN INPUT CLOCK SIGNAL

(75) Inventor: David A. Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/854,849

(22) Filed: May 25, 2004

(65) Prior Publication Data

US 2005/0264325 A1 Dec. 1, 2005

(51) Int. Cl.
*G06F 1/04* (2006.01)

(52) U.S. Cl. ........................... 327/291; 327/293

(58) Field of Classification Search ............... 327/105, 327/291, 293, 149, 158, 161, 295, 298, 233; 365/233
See application file for complete search history.

(56) References Cited

U.S. PATENT DOCUMENTS

| | | | |
|---|---|---|---|
| 5,077,737 A | 12/1991 | Leger et al. ............... 371/10.1 |
| 5,309,035 A | 5/1994 | Watson, Jr. et al. ........ 307/269 |
| 5,369,640 A | 11/1994 | Watson et al. .................. 371/1 |
| 5,615,358 A | 3/1997 | Vogley ......................... 395/556 |
| 5,675,265 A | 10/1997 | Yamamori ..................... 327/3 |
| 5,694,377 A | 12/1997 | Kushnick ..................... 368/120 |
| 5,920,510 A | 7/1999 | Yukutake et al. ...... 365/189.05 |
| 5,963,502 A | 10/1999 | Watanabe et al. ........... 365/233 |
| 6,005,430 A | 12/1999 | Brown et al. ................ 327/277 |
| 6,060,928 A | 5/2000 | Jun et al. ..................... 327/261 |
| 6,069,508 A | 5/2000 | Takai .......................... 327/161 |
| 6,111,812 A | 8/2000 | Gans et al. .................. 365/233 |
| 6,111,925 A | 8/2000 | Chi ............................. 375/354 |
| 6,166,990 A | 12/2000 | Ooishi et al. ................ 365/233 |
| 6,175,605 B1 | 1/2001 | Chi ............................. 375/371 |
| 6,222,408 B1 | 4/2001 | Saeki ......................... 327/271 |
| 6,222,792 B1 | 4/2001 | Hanzawa et al. ........... 365/233 |
| 6,236,251 B1 | 5/2001 | Akamatsu ................... 327/144 |
| 6,300,807 B1 * | 10/2001 | Miyazaki et al. ........... 327/158 |
| 6,310,822 B1 * | 10/2001 | Shen .......................... 365/233 |
| 6,313,674 B1 | 11/2001 | Akita et al. ................. 327/155 |
| 6,330,627 B1 | 12/2001 | Toda ........................... 710/104 |

(Continued)

OTHER PUBLICATIONS

Cho, Uk-Rae et al., "*A 1.2-V 1.5-Gb/s 72-Mb DDR3 SRAM*", IEEE Journal of Solid-State Circuits, vol. 38, No. 11, Nov. 2003, pp. 1943-1950.

(Continued)

*Primary Examiner*—Linh My Nguyen
(74) *Attorney, Agent, or Firm*—Dorsey & Whitney LLP

(57) ABSTRACT

Delay circuits are used in a manner similar to a synchronized mirror delay circuit to generate a quadrature clock signal from an input clock signal. The input clock signal is coupled through a series of first delay circuit for one-half the period of the input clock signal. A second series of feedback delay circuits mirror respective first delay circuits. After the input signal has been coupled through the first delay circuits, the mirrored signals from the first delay circuits are coupled through the feedback delay circuits. The delay of the feedback delay circuits is one-half the delay of the first delay circuits to provide a signal that is the quadrature of the clock signal.

26 Claims, 11 Drawing Sheets

U.S. PATENT DOCUMENTS

| | | | |
|---|---|---|---|
| 6,360,271 B1 | 3/2002 | Schuster et al. | 709/231 |
| 6,373,303 B1 | 4/2002 | Akita | 327/156 |
| 6,373,913 B1 | 4/2002 | Lee | 375/376 |
| 6,396,323 B1 | 5/2002 | Mizumo | 327/295 |
| 6,437,619 B1 | 8/2002 | Okuda et al. | 327/158 |
| 6,473,360 B1 | 10/2002 | Ooishi | 365/233 |
| 6,476,653 B1 | 11/2002 | Matsuzaki | 327/158 |
| 6,489,824 B1 | 12/2002 | Miyazaki et al. | 327/158 |
| 6,522,599 B1 | 2/2003 | Ooishi et al. | 365/233 |
| 6,560,715 B1 | 5/2003 | Bourdillat et al. | 713/600 |
| 6,570,419 B1 | 5/2003 | Hanzawa et al. | 327/152 |
| 6,570,813 B1 | 5/2003 | Van De Graaff | 365/233 |
| 6,580,649 B1 | 6/2003 | Park | 365/189.07 |
| 6,605,969 B1 | 8/2003 | Mikhalev et al. | 327/158 |
| 6,608,514 B1 | 8/2003 | Akita et al. | 327/291 |
| 6,611,475 B1 | 8/2003 | Lin | 365/233 |
| 6,617,894 B1 | 9/2003 | Yoon et al. | 327/161 |
| 6,618,319 B1 | 9/2003 | Ooishi et al. | 365/233 |
| 6,621,316 B1 | 9/2003 | Kirsch | 327/161 |
| 6,636,110 B1 | 10/2003 | Ooishi et al. | 327/565 |
| 6,665,231 B1 | 12/2003 | Mizuno et al. | 365/233 |
| 6,745,271 B1 | 6/2004 | Toda | 710/104 |
| 6,794,913 B1 | 9/2004 | Stengel | 327/158 |
| 6,798,259 B1 | 9/2004 | Lin | 327/153 |
| 6,801,070 B1 | 10/2004 | Gomm et al. | 327/263 |
| 6,891,415 B1 | 5/2005 | Mikhalev et al. | 327/158 |

OTHER PUBLICATIONS

Lin, Feng et al., "*A Register-Controlled Symmetrical DLL for Double-Data-Rate DRAM*", IEEE Journal of Solid-State Circuits, vol. 34, No. 4, Apr. 1999, pp. 565-568.

Matano, Tatsuya et al., "*A 1-Gb/s/pin 512-Mb DDRII SDRAM Using a Digital DLL and a Slew-Rate-Controlled Output Buffer*", IEEE Journal of Solid-State Circuits, vol. 38, No. 5, May 2003, pp. 762-767.

Saeki, Takanori et al., "*A 2.5-ns Clock Access, 250-MHz, 256-Mb SDRAM with Synchronous Mirror Delay*", IEEE Journal of Solid-State Circuits, vol. 31, No. 11, Nov. 1996, pp. 1656-1665.

Takai, Yasuhiro et al., "*A 250-Mb/s/pin, 1-Gb Double-Data-Rate SDRAM with a Bidirectional Delay and an Interbank Shared Redundancy Scheme*", IEEE Journal of Solid-State Circuits, vol. 35, No. 2, Feb. 2000, pp. 149-159.

* cited by examiner

SYSTEM AND METHOD FOR OPEN-LOOP SYNTHESIS OF OUTPUT CLOCK SIGNALS HAVING A SELECTED PHASE RELATIVE TO AN INPUT CLOCK SIGNAL

TECHNICAL FIELD

This invention relates to clock generation systems and methods, and, more particularly, to a system and method for generating a clock signal that has a selected phase relative to another signal despite variations in the frequency of the other signal without using phase-lock loops, delay-lock loops and other closed-loop techniques.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal, and write data signals are typically latched into a memory device in synchronism with a write data strobe signal. The read data strobe signal typically has the same phase as the read data signals, and it is normally generated by the same device that generates the read data signals. As a result, it is relatively easy to generate a read data strobe signal.

Unlike a read data strobe signal, a write data strobe signal normally must have a phase that is the quadrature of the write data signals so that a transition of the write data strobe signal occurs at the center of the period in which the write data signals are valid. Therefore, the write data strobe signal can latch the write data signals into the memory device at the center of the "data eye" in which the write data signals are valid. However, as the speed of memory devices continues to increase, the "data eye" becomes smaller and smaller, thus making the timing of the write data strobe signal even more critical.

The write strobe signal is typically generated by the memory controller from a system clock signal and it is coupled to the memory device into which the data are being written. Unfortunately, the phase of the system clock signal is normally substantially the same as the phase of the write data signals. Therefore, it is necessary for the memory controller to generate the write data strobe signal as a quadrature signal having a phase that is 90-degrees relative to the phase of the system clock signal.

Various techniques can be and have been used by memory devices to generate a quadrature write data strobe signal. If the frequency of the system clock signal is fixed, a quadrature write strobe signal can be generated by a timing circuit that simply generates a transition of the write strobe signal a fixed time after a corresponding transition of the system clock signal. However, synchronous memory devices are typically designed and sold to be operated over a wide range of system clock frequencies. Therefore, it is generally not practical to use a fixed timing circuit to generate a write data strobe signal from the system clock signal. Instead, a circuit that can adapt itself to a system clock signal having a range of frequencies must be used.

One conventional circuit that can generate a quadrature write data strobe signal from a system clock signal having a variable frequency is a phase-lock loop in which a voltage controlled oscillator generates a signal that is coupled to a phase detector along with the master clock signal. The phase detector generates an error signal that is used to control the frequency of the signal generated by the voltage controlled oscillator. Various signal processing techniques can be used to generate a quadrature signal from the signal generated by the voltage controlled oscillator.

Closed loop circuits, such as phase-lock loops and delay-lock loops, can accurately generate a quadrature write strobe signal based on the system clock signal over a substantial range of frequencies of the system clock signal. However, closed loop circuits are not without their disadvantages and limitations. Specifically, closed loop circuits typically require a substantial amount of circuitry, which occupies space on a semiconductor die that could otherwise be used for increased memory capacity. Furthermore, it typically requires a substantial period of time for the closed loop circuit to establish "lock" during which time the memory device cannot latch write data signals.

Quadrature digital signals are also required for applications other than for use as a write data strobe signal. For example, a "frequency doubler" circuit, which generates an output clock signal having twice the frequency of an input clock signal, can be implemented using an appropriate logic circuit that receives the input clock signal and a quadrature version of the input clock signal. However, generating the necessary quadrature clock signal has the same type of difficulties that are incurred in generating a quadrature write data strobe signal.

There is therefore a need for an open loop system and method for generating a periodic signal having a selected phase relative to another periodic signal despite substantial variations in the frequency of the periodic signal from which the periodic signal is generated.

SUMMARY OF THE INVENTION

A system and method for generating an output clock signal having a selected phase shift relative to an input clock signal is generated in an open-loop manner using a modified synchronized mirror delay circuit. The circuit includes a plurality of first delay circuits coupled in series with each other, each of which having a first delay. A plurality of second delay circuits are coupled in series with each other, each of which is coupled to a respective one of the first delay circuits in a manner of a synchronized mirror delay. Each of the second delay circuits has a second delay that is a predetermined percent of the first delay. The output clock signal is generated by the second delay circuit that is coupled to the first delay circuit to which the input clock signal is applied. The output clock signal has a phase relative to the input clock signal that corresponds to the delay of the second delay circuits relative to the delay of the first delay circuits. One or more series of additional delay circuits may be coupled to the first delay circuits in the manner of a synchronized mirror delay, and the delay of these delay circuits in each series can vary to provide clock signals having a variety of phases relative to the input clock signal.

DETAILED DESCRIPTION

Figure 1:
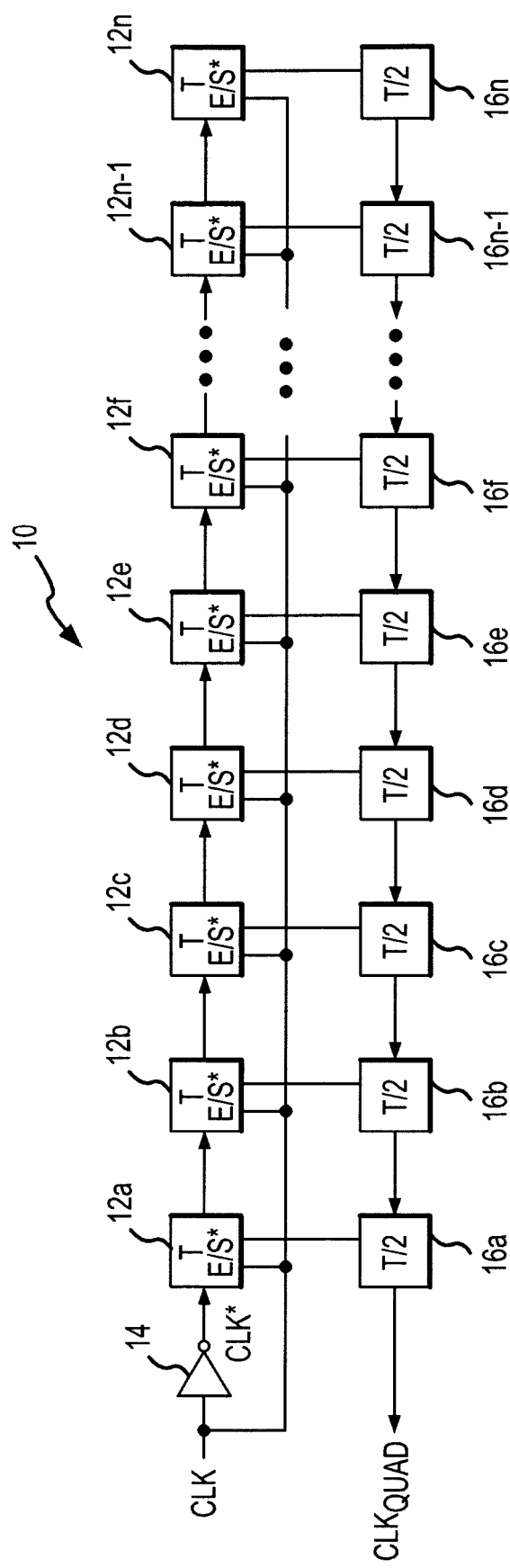
FIG. 1 is a block diagram of a circuit for generating quadrature clock signals according to one embodiment of the invention.

One embodiment of a signal generating circuit 10 for generating a quadrature clock signal is shown in FIG. 1. The circuit 10 includes a first series of delay circuits 12a–n that are coupled in series with each other. The first of the delay circuits 12a receives a compliment of a periodic clock ("CLK") signal, which is generated by coupling the CLK signal through an inverter 14. The CLK* signal is then coupled through the delay circuits 12a–n in a "forward" direction from left-to-right as shown in FIG. 1. Each of the delay circuits 12a–n delays a signal applied to its input by a delay time T. Each of the delay circuits 12a–n also includes an enable/set* terminal E/R that receives the CLK signal directly. The delay circuits 12a–n are enabled to allow the CLK* signal to propagate through the delay circuits 12a–n when the CLK signal is high. When the CLK signal is low, the delay circuits 12a–n are set to output a logic "1" signal.

The signal generating circuit 10 also includes a second series of delay circuits 16a–n that are coupled in series with each other. A respective delay circuit 16 in the second series is provided for each of the delay circuits 12 in the first series. Signals are coupled through the delay circuits 16a–n in a "reverse" direction from right-to-left as shown in FIG. 1. Unlike the delay circuits 12a–n, which provide a delay time of T, each of the delay circuits 16a–n provides a delay time of T/2, i.e., a delay time of half the delay time of the delay circuits 12a–n. Each of the delay circuits 12 in the first set is coupled to its respective delay circuits 16 in the second set in a manner that causes the output of each delay circuit 16 to mirror a low output of its respective delay circuit 12. When the output of a delay circuit 12 is high, the corresponding delay circuit 16 is enabled to allow signals to propagate through the delay circuits 16a–n. The delay circuits 12 and 16 are thus alternately enabled by the CLK signal since a high CLK signal enables the delay circuits 12, and a low CLK signal sets the delay circuits 12 to output a high, which enables the delay circuits 16. The circuit 10 is similar to a conventional synchronous mirror delay ("SMD") circuit except that in a typical SMD circuit the delay times of the "forward" delay circuits are normally the same as the delay times of the "reverse" delay circuits.

Figure 2A:
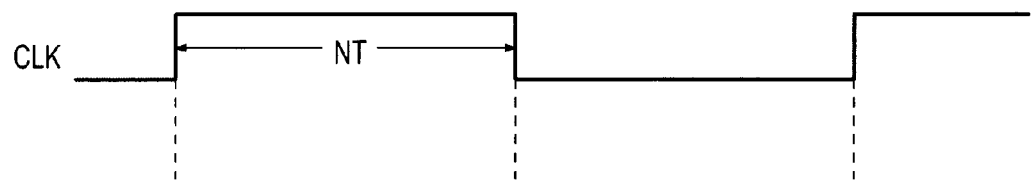
FIGS. 2A and 2B are timing diagrams showing the operation of the circuit of FIG. 1.

The operation of the signal generating circuit 10 will now be explained with reference to the timing diagram of FIG. 2A and 2B. The CLK signal transitions high at time to (FIG. 2A), thereby causing a low CLK* signal to be applied to the first delay circuit 12a. Prior to time to, the low CLK signal acts as an active low set signal to set the delay circuits 12a–n so that all of the delay circuits 12a–n output a high signal. Therefore, assuming for purposes of example that there are 10 delay circuits 12a–j, the outputs of the delay circuits 12a–j will be "1111111111" prior to to. The transition to a high CLK signal at time to enables the delay circuits 12a–n so that the low CLK* signal is sequentially coupled through the delay circuits 12a–j. When the CLK signal transitions low at time $t_1$, the prior low or logic "0" CLK* signal will have propagated through a number of the delay circuits 12a–n corresponding to the period of the CLK signal and the value of the delay time T. Assuming for purposes of example that logic "0" CLK* signal propagates through the first 5 of the delay circuits 12a–e between to and $t_1$, the outputs of the delay circuits 12a–j will be "0000011111" at time $t_1$. The outputs of the delay circuits 16a–j will also be "0000011111" at time $t_1$ since, as explained above, the output of each of the delay circuits 16 mirrors a low output of a respective one of the respective delay circuits 12.

On the falling edge of the CLK signal at time $t_1$, the delay circuits 12a–j are all set so that they each output a high signal. The delay circuits 12a–j thus collectively output "1111111111." As explained above, the high signals from the outputs of the delay circuits 12a–j enable signal propagation through respective delay circuits 16a–j. Thus, at time $t_1$, the signals "0000011111" in the delay circuits 16a–j will begin propagating back through the delay circuits from right-to-left as shown in FIG. 1. The logic "1" signal that is being output from the sixth delay circuit 16f must propagate through the same number of delay circuits 16a–j that the logic "0" CLK* signal propagated through the delay circuits 12a–j (i.e., 5 delay circuits 16a–e). Since the delay time T/2 of the delay circuits 16 is half the delay time T of the delay circuits 12, a logic "1" signal will be output from the delay circuit 16a as the quadrature clock signal $CLK_{QUAD}$ at time $t_2$, which is one-quarter of a period of the CLK signal after $t_1$, as shown in FIG. 2B.

At time $t_3$, the CLK transitions high, thereby once again coupling a logic "0" CLK* signal to the first delay circuit 12a and enabling all of the delay circuits 12a–j. However, just prior to time $t_3$, the outputs of the delay circuits 12a–j and 16a–j will each be "1111111111." At time $t_4$, which is one delay period T after $t_3$, the logic "0" CLK* signal will propagate to the output of the first delay circuit 12a thereby causing the delay circuit 16a to output a logic "0" or low $CLK_{QUAD}$ signal. The signal $CLK_{QUAD}$ thus transitions low at time $t_4$, as shown in FIG. 2B. The circuit 10 then repeats the operation explained above starting at time $t_0$.

Figure 2B:
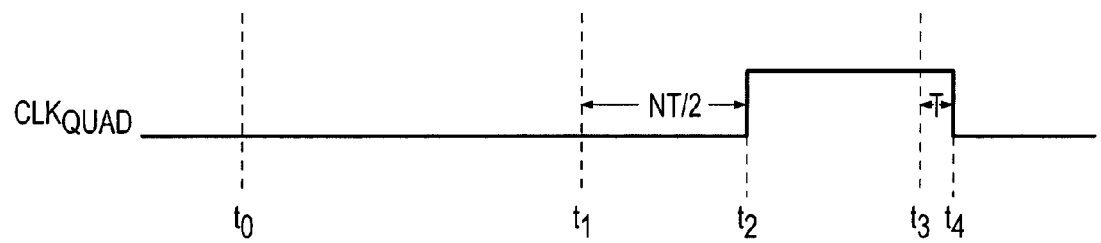
Figure 3:
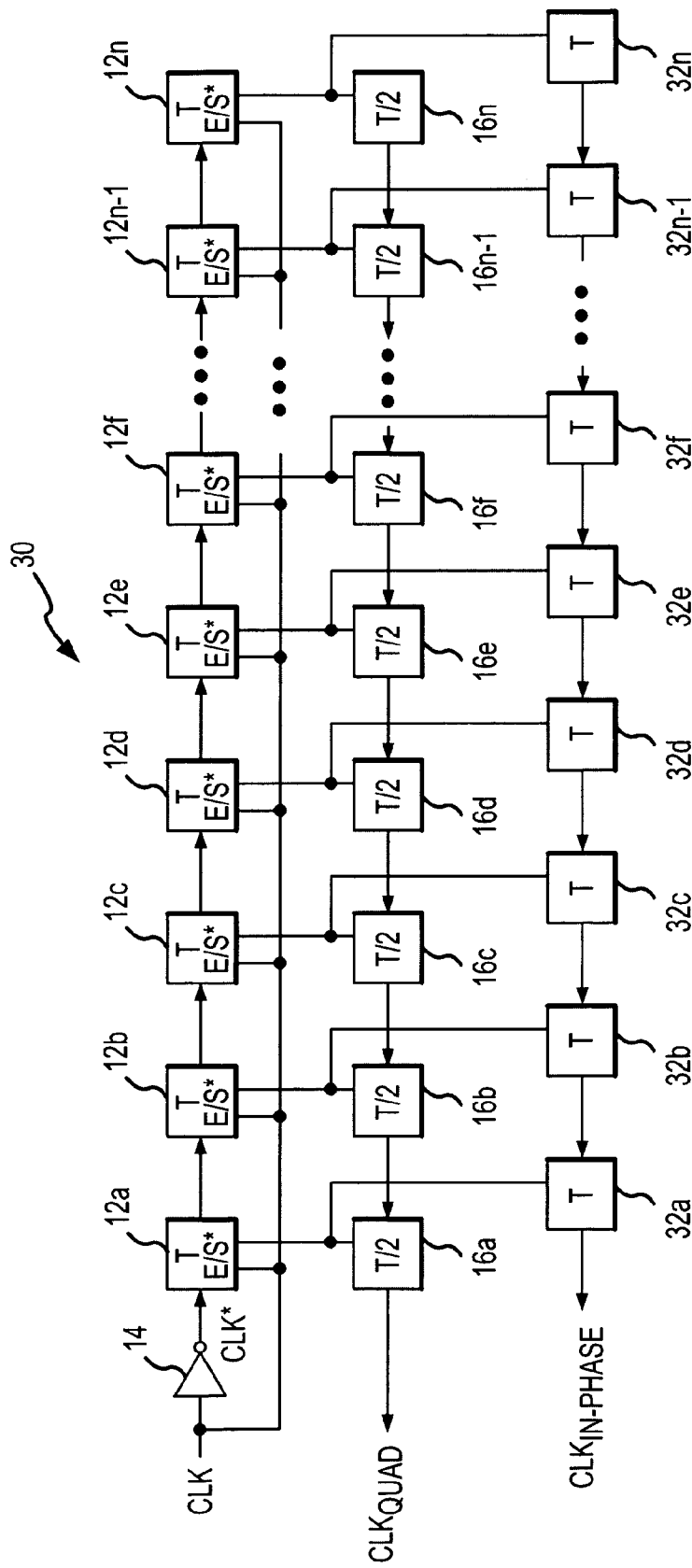
FIG. 3 is a block diagram of a circuit for generating quadrature clock signals according to another embodiment of the invention.

Although the rising edge of the quadrature clock signal $CLK_{QUAD}$ is shown in FIG. 2B as being in the center of the logic "0" portion of the CLK signal, such may not always be the case. In particular, the period of the CLK signal may not be an integer multiple of the delay time T of the delay circuits 12, 16 so that signals will start or stop propagating through the delay circuits 12a–n and 16a–n when the signals have only partially propagated through the delay circuits. For this reason, it is desirable to create an in-phase clock signal $CLK_{IN-PHASE}$ corresponding to the CLK signal using an embodiment of a circuit 30 for generating quadrature clock signals as shown in FIG. 3. The circuit 30 is essentially the same as the circuit 10 shown in FIG. 1 except that it includes a second series of feedback delay circuits 32a–n. The delay circuits 32a–n function in the same manner as the delay circuits 16a–n except that they have a delay of T, which is the same as the delay of the delay circuits 12a–n, rather than a delay of T/2 like the delay circuits 16a–n.

Figure 4:
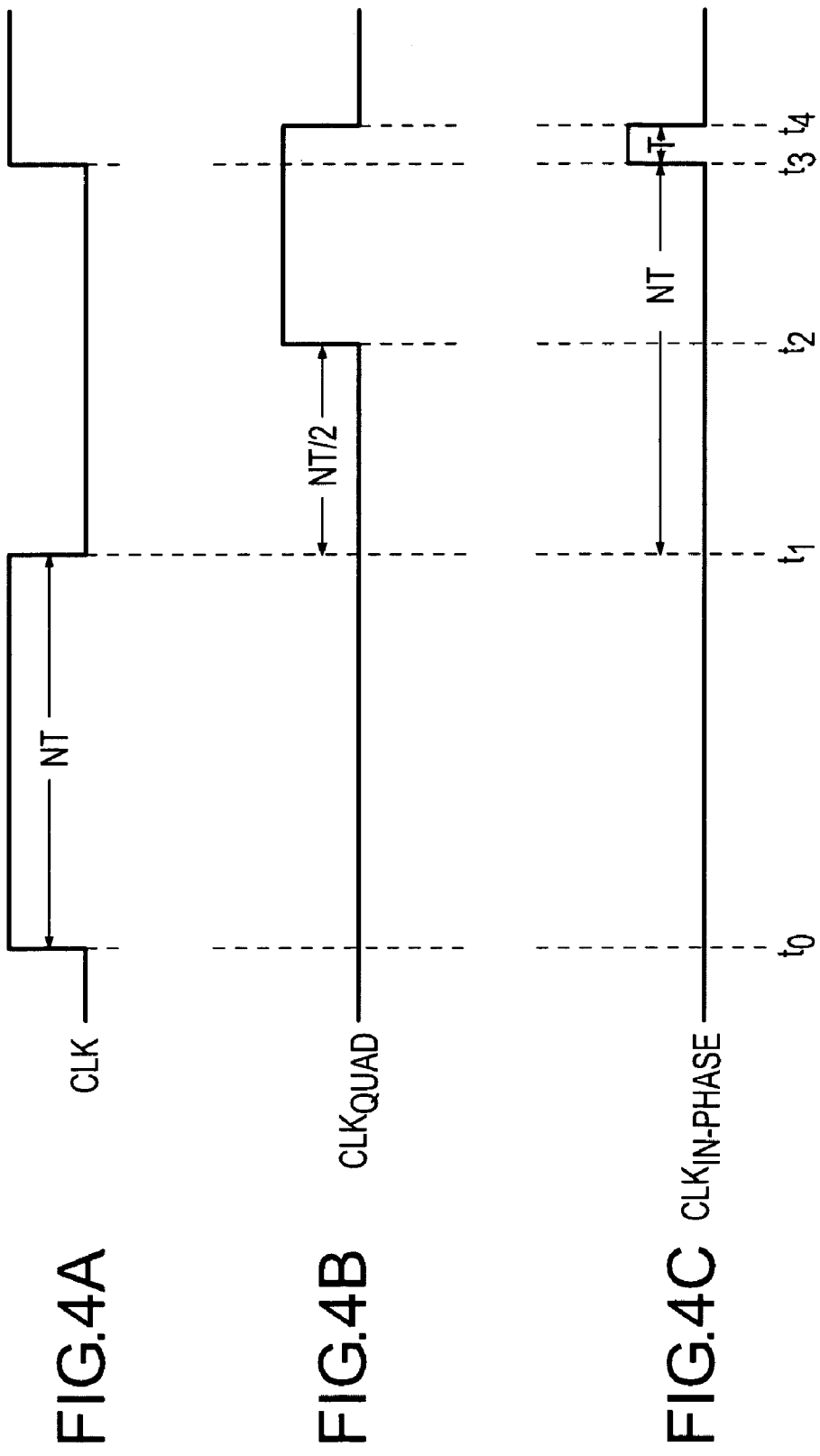
FIGS. 4A–C are timing diagrams showing the operation of the circuit of FIG. 3.

Using the above example with reference to FIGS. 4A and 4B, just prior to $t_0$ the outputs of the delay circuits 12a–j, 16a–j and 32a–j will each be "1111111111." At time $t_1$, the logic "0" CLK* signal will have propagated through the first five delay circuits 12a–e so the outputs of the delay circuits 12a–j will be "0000011111." However, since the outputs of the delay circuits 16a–j and 32a–j mirror the outputs of the respective delay circuits 12a–j, the outputs of the delay circuits 16a–j and 32a–j will also be "0000011111." When the CLK transitions low at time $t_1$, the delay circuits 12a–j are each set to "1" as explained above, thereby enabling signal propagation through the delay circuits 16a–j and 32a–j. The logic "1" signals at the outputs of the sixth through tenth delay circuits 16f–j and 32f–j then propagate back through the delay circuits 16f–j and 32f–j. As explained above with reference to FIGS. 1, 2A and 2B, the logic "1" signal that was being output from the sixth delay circuit 16f will propagate to the output of the delay circuit 16a at time $t_2$, which is one-quarter of a period of the CLK signal after $t_1$, as shown by the $CLK_{QUAD}$ signal in FIG. 4B. However, since the delay T of the delay circuits 32a–j is twice the delay T/2 of the delay circuits 16a–j, the logic "1" signal that was being output from the sixth delay circuit 32f will propagate to the output of the delay circuit 32a at time $t_3$, as shown in FIG. 4C. The $CLK_{IN-PHASE}$ signal at the output of the delay circuit 32a will therefore transition high at time $t_3$, which is approximately one-half of a period of the CLK signal after $t_1$. At time $t_4$, the falling edge of the CLK* signal propagates to the output of the first delay circuit 12a, thereby causing the $CLK_{QUAD}$ signal at the output of the delay circuits 16a and the $CLK_{IN-PHASE}$ signal at the output of the delay circuit 32a to transition low, as shown in FIGS. 4B and 4C, respectively.

Figure 5:
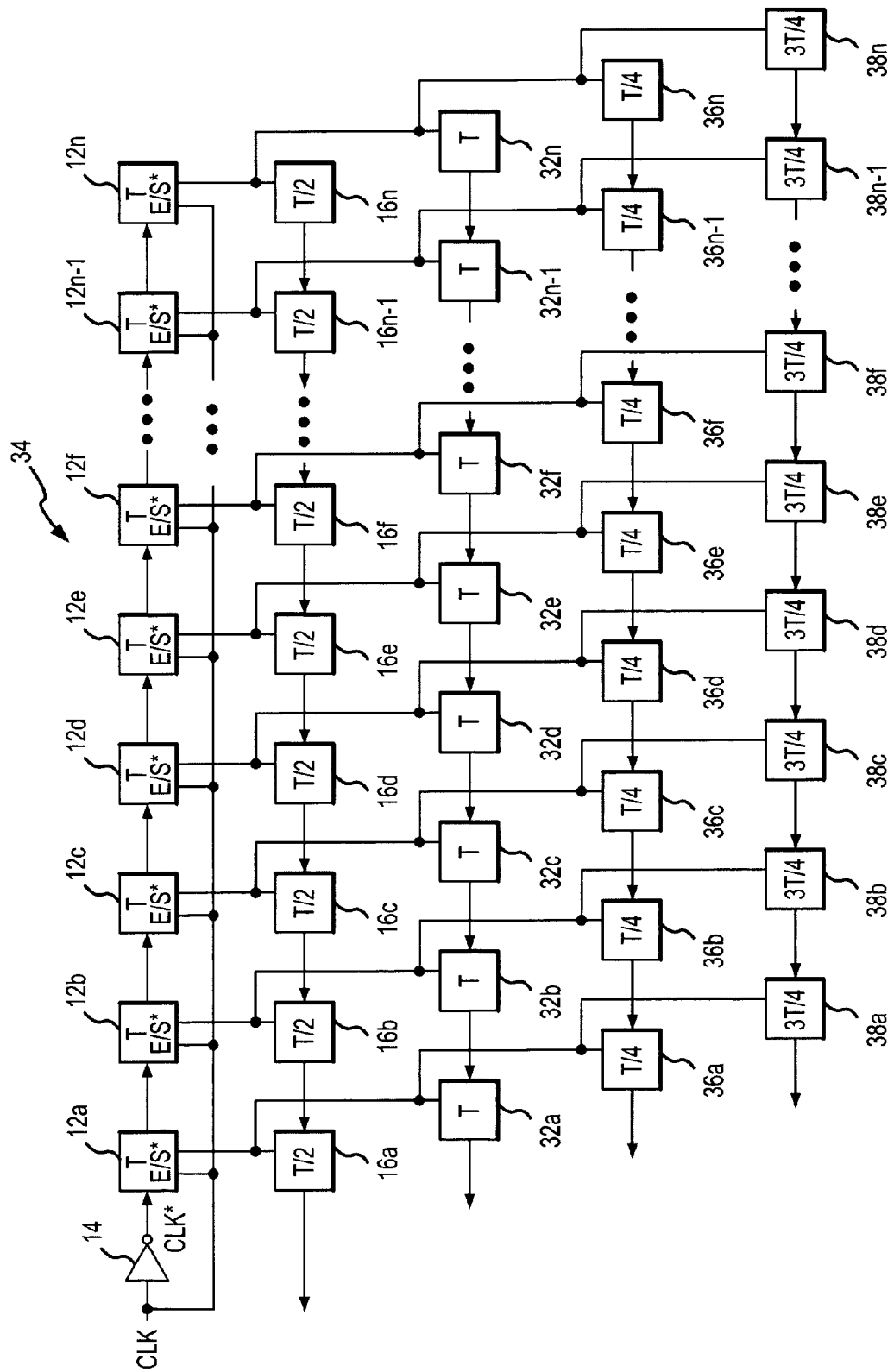
FIG. 5 is a block diagram of a circuit for generating clock signals at various phases of an input clock signal to another embodiment of the invention.

Another embodiment of a circuit 34 for generating a quadrature clock signal is shown in FIG. 5. The circuit 34 is essentially the same as the circuit 30 shown in FIG. 3 except that it adds a third and fourth series of feedback delay circuits 36a–n and 38a–n, respectively. The delay circuits 36a–n, 38a–n function in the same manner as the delay circuits 32a–n except that they have a delay of T/4 and 3T/4, respectively. The delay circuit 36a outputs a clock signal having a rising edge at substantially the 45 degree or 225 degree phase of the CLK signal, and the delay circuit 38a outputs a clock signal having a rising edge at substantially 135 degree or 315 degree phase of the CLK signal. The delay circuit 16a continues to output a clock signal having a rising edge at substantially the 90 degree or 270 degree phase of the CLK signal, and the delay circuit 32a continues to output a clock signal having a rising edge at substantially the 0 degree or 180 degree phase of the CLK signal. By appropriately selecting the delay of the delay circuits, a clock signal having any phase of the CLK signal can be generated. By selecting the number of sets of feedback delay circuits that are used, clock signals having any number of phases of the CLK signal can be generated.

Figure 6:
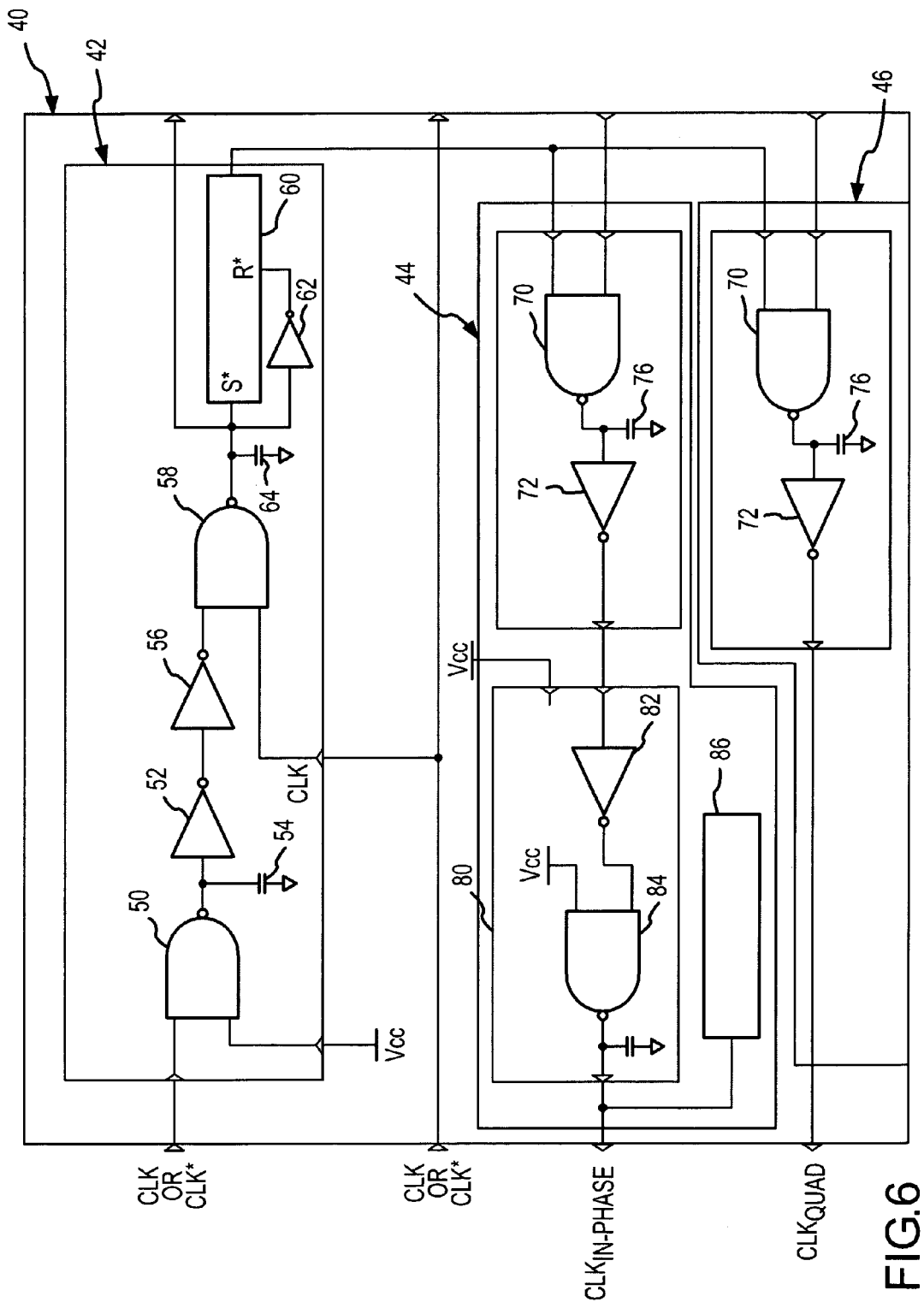
FIG. 6 is a logic diagram of one embodiment of a delay circuit that can be used in the circuits of FIGS. 1, 3, and 5.

One embodiment of a delay circuit 40 that can be used as the delay circuits 12, 16, 32, 36, 38 is shown in FIG. 6. The delay circuit 40 includes a forward delay circuit 42 corresponding to the delay circuits 12, which provide a delay of T, a first mirrored or backward delay circuit 44 corresponding to the delay circuits 32, which provides a delay of T, and a second mirrored or backward delay circuit 46 corresponding to the delay circuits 16, which provides a delay of T/2. The forward delay circuit 42 includes a NAND gate 50 having a first input coupled to Vcc to cause it to function as an inverter. The NAND gate 50 has another input that is either coupled to receive the CLK or CLK* signal when functioning as the first delay circuit 12a or otherwise coupled to the output of an upstream delay circuit 42.

The output of the NAND gate 50 is coupled to an inverter 52 and to a capacitor 54, which functions to delay signal transitions at the output of the NAND gate 50. The output of the inverter 52 is coupled through another inverter 56 to an input of a NAND gate 58, which receives either the CLK* or CLK signal, depending upon which is the compliment of the signal coupled to the input of the NAND gate 50 for the first delay circuit 40 in the series. Thus, if CLK is coupled to the input of the NAND gate 50 of the first delay circuit 40, CLK* is coupled to the input of the NAND gate 58. If CLK* is coupled to the input of the NAND gate 50 of the first delay circuit 40, CLK is coupled to the input of the NAND gate 58. The output of the NAND gate 58 serves at the output of the delay circuit 42, and it is coupled to an active low set* terminal of a set-reset latch 60, an active low reset* terminal of the latch 60 through an inverter 62, and to a capacitor 64, which provides an additional delay or models interconnecting metal lines for simulation purposes. The delay circuit 40 thus provides a delay of T corresponding to the propagation delay through two NAND gates 50, 56 and two inverters 52, 54.

In operation, assuming that the NAND gate 50 receives the CLK* signal and the NAND gate 58 receives the CLK signal, the output of the delay circuit 42 will be logic "1" whenever the CLK signal is low. This logic "1" signal will set the latch 60 so that it also outputs a logic "1." When the CLK signal transitions high, the CLK* signal coupled to the NAND gate 50 transitions low, and this low propagates through the NAND gate 50, the inverters 52, 56 and the NAND gate 58 with a delay of T. Thus, after a delay of T, the output of the delay circuit 42 transitions low, which also resets the latch 60 to output a low.

The structure and operation of the backward delay circuits 44, 46 are very similar to each other. The backward delay circuits 44, 46 each include a NAND gate 70 having one input coupled to the output of the latch 60 and another input coupled that is either coupled to $V_{CC}$ when functioning as the last delay circuit 12n or otherwise coupled to the output of an upstream delay circuit 44, 46 respectively. The output of the NAND gate 70 is coupled to an inverter 72 and to a capacitor 76. For the delay circuit 46 having a delay of T/2, the output of the inverter 72 serves as the output of the delay circuit 46. The delay of T/2 provided by the delay circuit 46 thus corresponds to the propagation delay through one NAND gate 70 and one inverter 72 in contrast to the delay of T provided by the propagation delays through two NAND gates 50, 56 and two inverters 52, 54.

The delay circuit 44 has an additional delay stage 80 that includes an inverter 82 coupled to the output of the inverter 72 and a NAND gate 84. The NAND gate 84 has one input coupled to $V_{CC}$ so that it functions as an inverter, and another input coupled to the output of the inverter 82. The output of the NAND gate 84 serves as the output of the delay circuit 44, and it is coupled to a latch 86, which serves no function other than to load the NAND gate 84 with the same impedance that the latch 60 loads the NAND gate 58 so that the delay of the delay circuit 44 will be substantially the same as the delay of the delay circuit 42.

In operation, the delay circuits 42, 44, 46 will all output a logic "1" signal when the CLK signal is low, since the logic "1" signal at the output of the latch 60 enables the NAND gates 70. When the CLK signal transitions high, the logic "0" CLK* signal propagates to the output of the delay circuit 42, thereby resetting the output of the latch 60 low. As a result, the NAND gates 70 are disabled, thereby causing the delay circuits 44, 46 to each output a logic "0." When the CLK signal again transitions low, the latch 60 is set to output a logic "1" thereby enabling the NAND gates 70. The signals output by upstream delay circuits 44, 46 (or $V_{CC}$ in the case of the most upstream delay circuit 40) then propagate through the delay circuits 44, 46, respectively, until the CLK signal transitions high, as explained above with reference to FIGS. 1–5.

Figure 7:
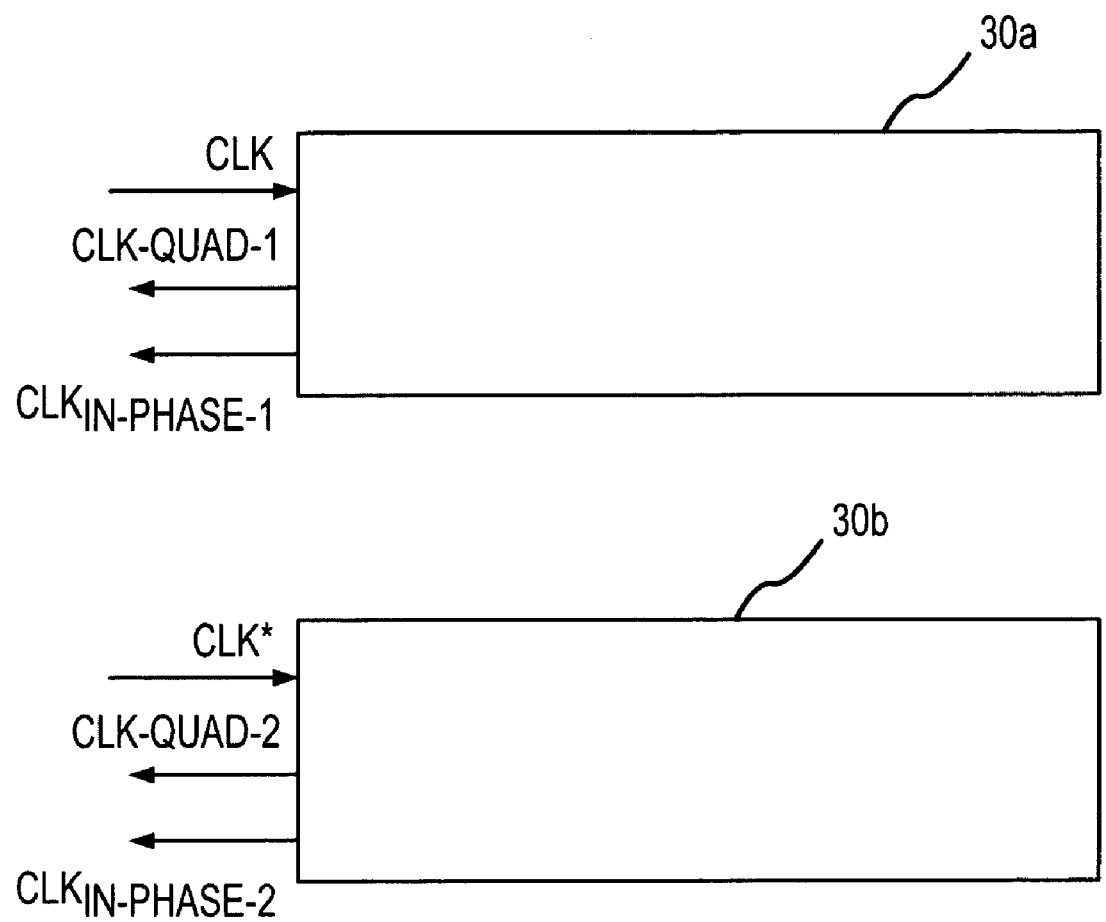
FIG. 7 is a block diagram of a circuit for generating quadrature clock signals according to another embodiment of the invention.
Figure 8:
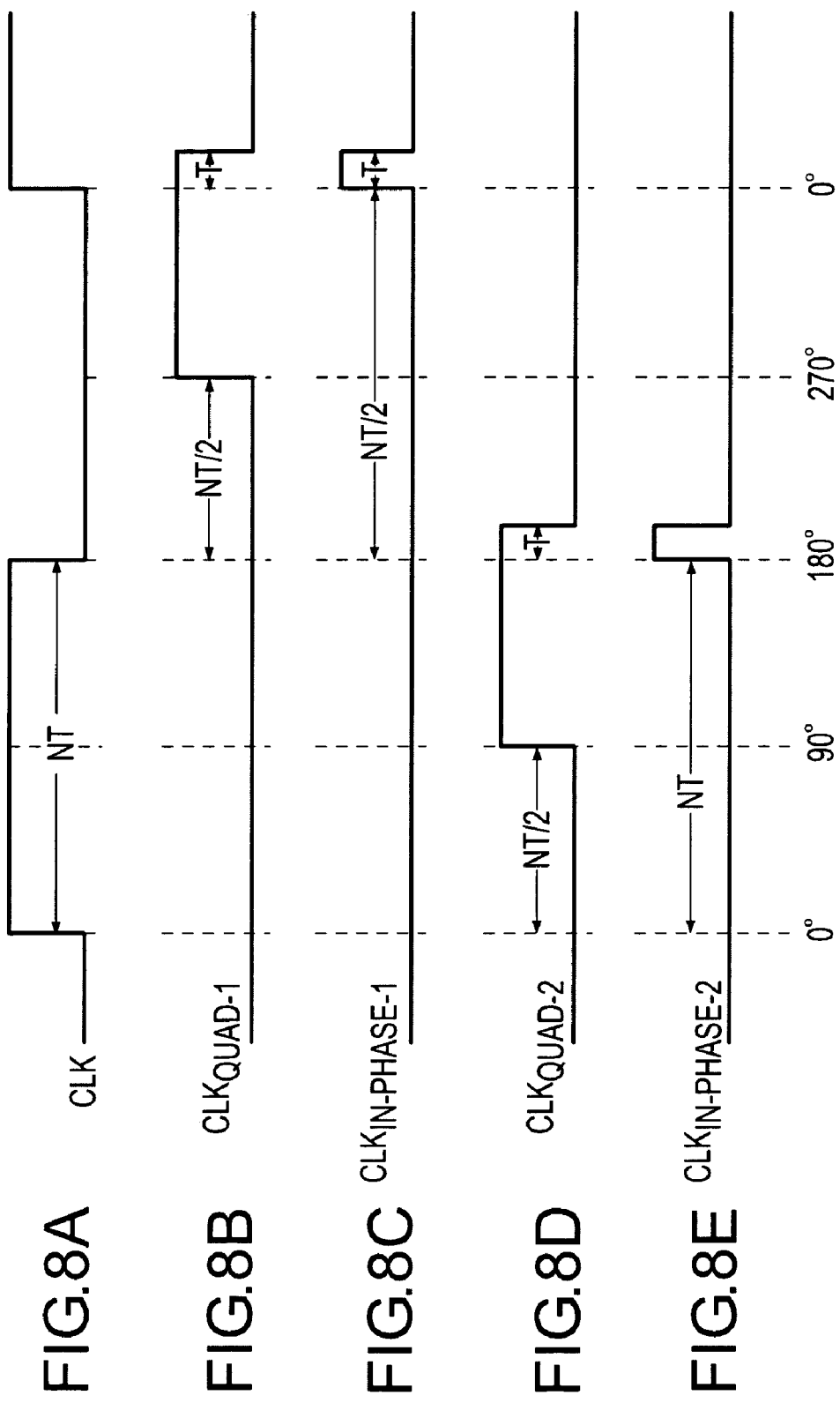
FIGS. 8A–E are timing diagrams showing the operation of the circuit of FIG. 7.

It can be observed from FIGS. 4A–C that the $CLK_{QUAD}$ signal shown in FIG. 4B is generated during only the portion of the CLK signal shown in FIG. 4A where the CLK signal is low. Similarly, the $CLK_{IN-PHASE}$ signal shown in FIG. 4C is generated during only the portion of the CLK signal shown in FIG. 4A where the CLK signal is high. However, it is desirable for the $CLK_{QUAD}$ signal and the $CLK_{IN-PHASE}$ signal to also be generated during the other portions of the CLK. This can be accomplished using two of the circuits 30 shown in FIG. 3, which are configured as shown in FIG. 7. A first circuit 30a is coupled to receive the CLK signal in the same manner as the circuit 30 shown in FIG. 3. With reference to FIGS. 8A–C, the circuit 30a thus generates a first quadrature clock signal $CLK_{QUAD-1}$ (FIG. 8B) during the logic "0" portion of the CLK signal (FIG. 8A) with a rising edge at approximately 270 degrees relative to the CLK signal. The circuit 30a also generates a first in phase clock signal $CLK_{IN-PHASE-1}$ (FIG. 8C) during the logic "1" portion of the CLK signal with a rising edge at approximately 0 degrees relative to the CLK signal. A second circuit 30b receives the CLK* signal and thus generates a second quadrature clock signal $CLK_{QUAD-2}$ (FIG. 8D) during the logic "1" portion of the CLK signal with a rising edge at approximately 90 degrees relative to the CLK signal. The second also generates a second in phase clock signal $CLK_{IN-PHASE-2}$ (FIG. 8E) during the logic "0" portion of the CLK signal with a rising edge at approximately 180 degrees relative to the CLK signal. The circuits 30a,b thus generate quadrature signals having rising edges at 90 and 270 degrees and in-phase signals having rising edges at 0 and 180 degrees. These signals can be used in a variety of manners. For example, as explained in greater detail below, the 90 and 270 quadrature signals they can be used as write strobe signals to latch write data into a memory device, and the 0 and 180 degree signals can be used a read strobe signals that are coupled from a memory device along with read data. Other uses for these signals will be apparent to one skilled in the art.

Figure 9:
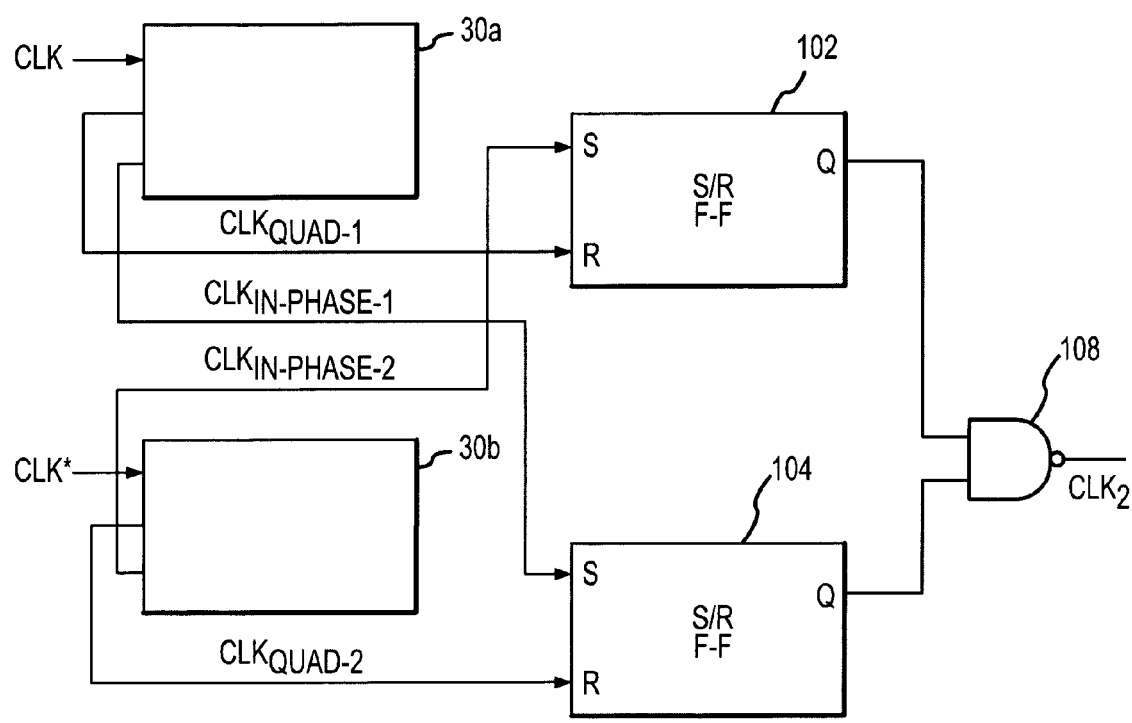
FIG. 9 is a block diagram of a frequency doubler circuit using the quadrature and in-phase clock signals generated by the circuit of FIG. 7.
Figure 10:
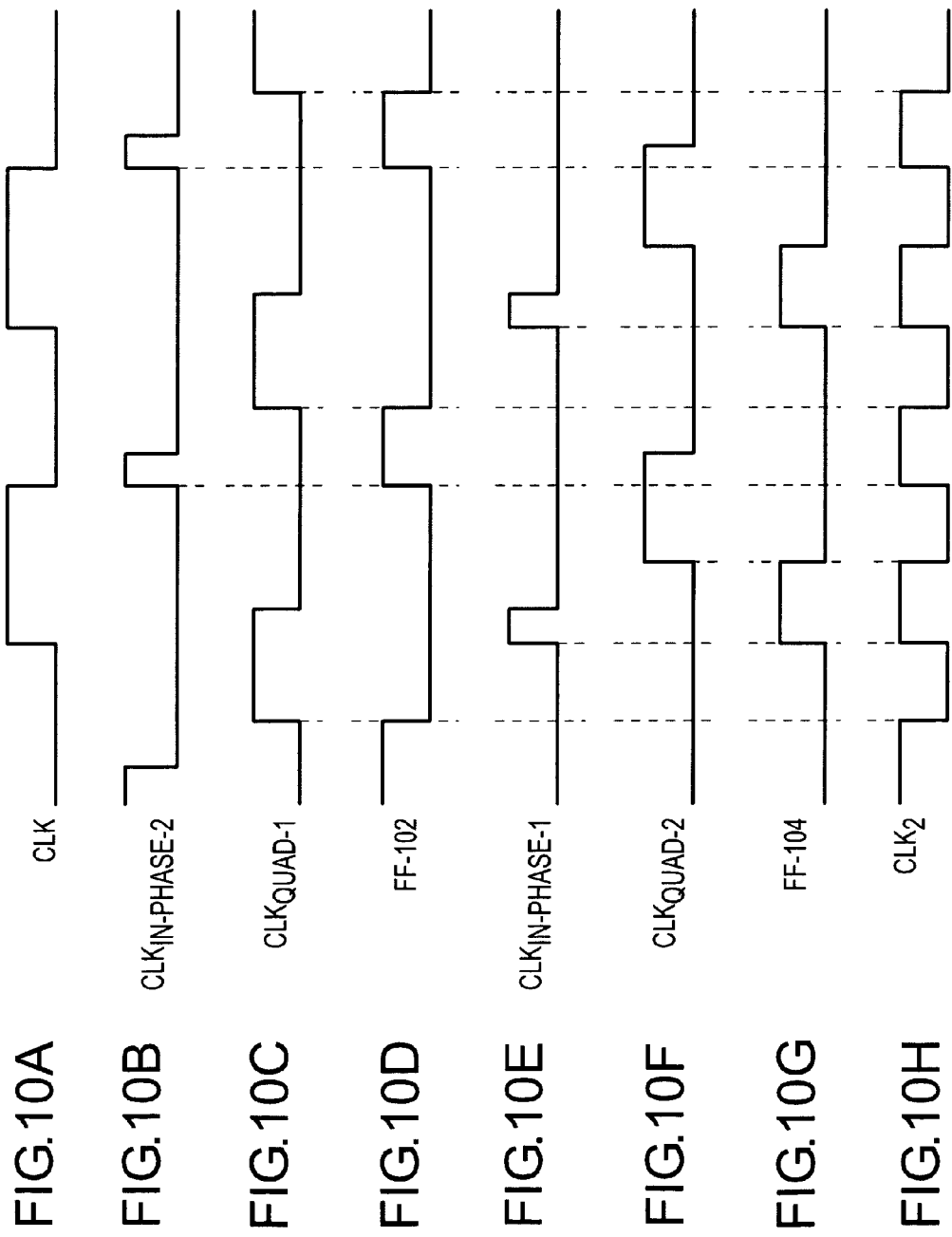
FIGS. 10A–H are timing diagrams showing the operation of the frequency doubler circuit of FIG. 7.

One embodiment of a frequency doubler circuit 100 that uses the signals generated by the circuits 30a,b configured as shown in FIG. 7 is shown in FIG. 9. The frequency doubler circuit 100 includes a pair of set/reset flip-flops 102, 104 that are coupled to receive the clock signals from the circuits 30a,b configured as shown in FIG. 7. The first flip-flop 102 is set by the $CLK_{IN-PHASE-2}$ signal at 180 degrees relative to the CLK signal, as shown in FIG. 10B. The first flip-flop 102 is reset by the $CLK_{QUAD-1}$ signal at 270 degrees relative to the CLK signal, as shown in FIG. 10C. The output of the flip-flop 102 is therefore a signal that transitions high at 180 degrees and transitions low at 270 degrees, as shown in FIG. 10D. The second flip-flop 104 is set by the $CLK_{IN-PHASE-1}$ signal at 0 degrees relative to the CLK signal, as shown in FIG. 10E. The second flip-flop 104 is reset by the $CLK_{QUAD-2}$ signal at 90 degrees relative to the CLK signal, as shown in FIG. 10F. The output of the flip-flop 104 is therefore a signal that transitions high at 0 degrees and transitions low at 90 degrees, as shown in FIG. 10G. The outputs of the flip-flops 102, 104 are combined by a NAND gate 108 to generate the $CLK_2$ signal shown in FIG. 10H. It will be apparent from comparing the $CLK_2$ signal to the CLK signal shown in FIG. 10A that the $CLK_2$ signal has twice the frequency of the CLK signal.

Figure 11:
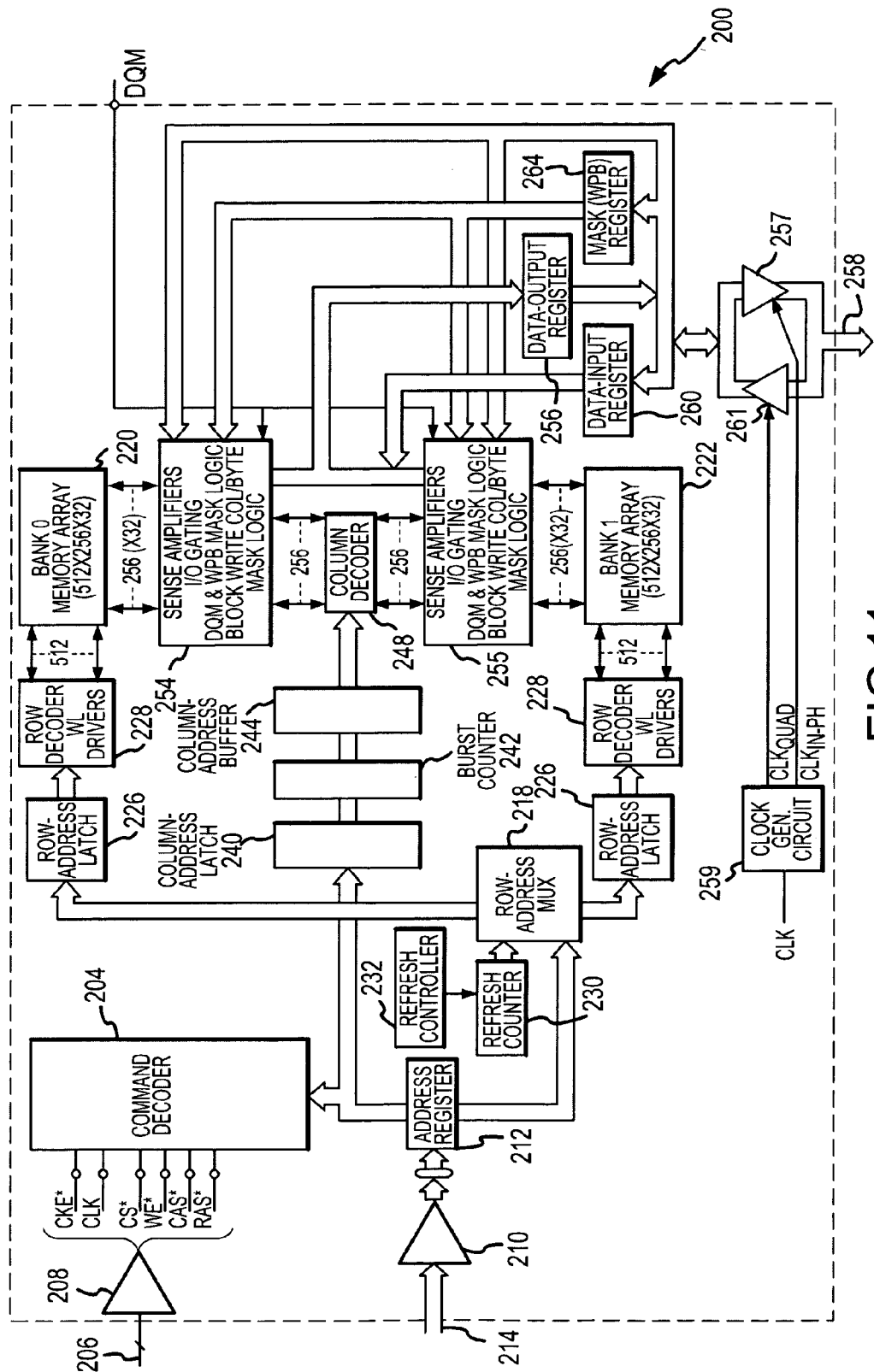
FIG. 11 is a block diagram of a memory device using the quadrature and in-phase clock signals generated by the circuit of FIG. 7 as write data and read data strobe signals.

As mentioned above, the quadrature clock generating circuits of the present invention can be used to generate a read data strobe signal and a write data strobe signal in a memory device. With reference to FIG. 11, a synchronous dynamic random access memory ("SDRAM") 200 includes a command decoder that controls the operation of the SDRAM 200 responsive to high-level command signals received on a control bus 206 and coupled thorough input receivers 208. These high level command signals, which are typically generated by a memory controller (not shown in FIG. 11), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 11). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe signal generated by a clock generating circuit 259 in accordance with the present invention. The clock generating circuit 259 receives a periodic CLK signal and generates $CLK_{QUAD}$ and $CLK_{IN-PHASE}$ signals, as explained above. The $CLK_{IN-PHASE}$ signal is used as a read data strobe signal so that the read data are coupled to the data bus 258 in substantially in phase with the CLK signal.

Data to be written to one of the arrays 220, 222 are coupled from the data bus 258 through data input receivers 260 to a data input register 261. The data input receivers 260 couple the write data from the data bus 258 responsive to the $CLK_{QUAD}$ signal, which is used as a write data strobe signal. As a result, the write data are coupled into the SDRAM 200 from the data bus 258 at the center of a "data eye" corresponding to the phase of the CLK signal. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Although the present invention has been described with reference to the disclosed embodiments, persons skilled in the art will recognize that changes may be made in form and detail without departing from the spirit and scope of the invention.

I claim:

1. A system for generating an output clock signal that has a predetermined phase relative to an input clock signal, comprising:

a plurality of first delay circuits coupled in series with each other from an initial first delay circuit that is coupled to receive the input clock signal to a final first delay circuit, each of the first delay circuits providing a first delay to a signal applied to its input, the first delay circuits being responsive to a first transition of the input clock signal to propagate a signal through the first delay circuits from the initial first delay circuit toward the final first delay circuit;

a plurality of second delay circuits coupled in series with each other, each of the second delay circuits being coupled to a respective one of the first delay circuits in reverse order so that signals are coupled through the second delay circuits in a direction that is opposite the direction through which signals are coupled through the first delay circuits, each of the second delay circuits providing a second delay to a signal applied to its input that is a predetermined percent of the first delay, each of the second delay circuits generating an output signal that substantially mirrors an output signal from the respective first delay circuit at a second transition of the input clock signal, the second delay circuits being responsive to the second transition of the input clock signal to propagate the output signals generated by the second delay circuits to a final second delay circuit that is coupled to the initial first delay circuit, the output clock signal being generated by the final second delay circuit;

a plurality of third delay circuits coupled in series with each other, each of the third delay circuits being coupled to a respective one of the first delay circuits in reverse order so that signals are coupled through the third delay circuits in a direction that is opposite the direction through which signals are coupled through the first delay circuits, each of the third delay circuits providing a third delay to a signal applied to its input that is a predetermined percent of the first delay and is different from the first and second delays, each of the third delay circuits generating an output signal that substantially mirrors an output signal from the respective first delay circuit at the second transition of the input clock signal, the third delay circuits being responsive to the second transition of the input clock signal to propagate the output signals generated by the third delay circuits to a final third delay circuit that is coupled to the initial first delay circuit, a second output clock signal being generated by the final third delay circuit; and a plurality of fourth delay circuits coupled in series with each other, each of the fourth delay circuits being coupled to a respective one of the first delay circuits in reverse order so that signals are coupled through the fourth delay circuits in a direction that is opposite the direction through which signals are coupled through the first delay circuits, each of the fourth delay circuits providing a fourth delay to a signal applied to its input that is a predetermined percent of the first delay and is different from the first, second and third delays, each of the fourth delay circuits generating an output signal that substantially mirrors an output signal from the respective first delay circuit at the second transition of the input clock signal, the fourth delay circuits being responsive to the second transition of the input clock signal to propagate the output signals generated by the fourth delay circuits to a final fourth delay circuit that is coupled to the initial first delay circuit, a third output clock signal being generated by the final fifth delay circuit.

2. The system of claim 1 wherein the predetermined percent comprises 50 percent.

3. The system of claim 1 wherein the second delay is 50% of the first delay, the third delay is 25% of the first delay, and the fourth delay is 75% of the first delay.

4. The system of claim 1 wherein the outputs of the first delay circuits are set to a first logic level responsive to one logic level of the input clock signal, and wherein a second logic level propagates through the first delay circuits responsive to another logic level of the input clock signal.

5. A modified synchronized mirror delay circuit, comprising:

a plurality of first delay circuits coupled in series with each other, each of the first delay circuits having a first delay;

a plurality of second delay circuits coupled in series with each other, each of the second delay circuits being coupled to a respective one of the first delay circuits in a manner of a synchronized mirror delay, each of the second delay circuits having a second delay that is a predetermined percent of the first delay;

a plurality of third delay circuits coupled in series with each other, each of the third delay circuits being coupled to a respective one of the first delay circuits in the manner of a synchronized mirror delay, each of the third delay circuits having a third delay that is a predetermined percent of the first delay and is different from the second delay; and a plurality of fourth delay circuits coupled in series with each other, each of the fourth delay circuits being coupled to a respective one of the first delay circuits in the manner of a synchronized mirror delay, each of the fourth delay circuits having a fourth delay that is a predetermined percent of the first delay and is different from the second and third delays.

6. The modified synchronized mirror delay circuit of claim 5 wherein the predetermined percent comprises 50 percent.

7. The modified synchronized mirror delay circuit of claim 5 wherein the second delay is 50% of the first delay, the third delay is 25% of the first delay, and the fourth delay is 75% of the first delay.

8. A clock doubler circuit that generates an output clock signal that has twice the frequency of an input clock signal, comprising:

a plurality of first delay circuits coupled in series with each other from an initial first delay circuit that is coupled to receive the input clock signal to a final first delay circuit, each of the first delay circuits providing a first delay to a signal applied to its input, the first delay circuits being responsive to a first transition of the input clock signal to propagate a signal through the first delay circuits from the initial first delay circuit toward the final first delay circuit; and a plurality of second delay circuits coupled in series with each other, each of the second delay circuits being coupled to a respective one of the first delay circuits in reverse order so that signals are coupled through the second delay circuits in a direction that is opposite the direction through which signals are coupled through the first delay circuits, each of the second delay circuits providing a second delay to a signal applied to its input that is a predetermined percent of the first delay, each of the second delay circuits generating an output signal that substantially mirrors an output signal from the respective first delay circuit at a second transition of the input clock signal, the second delay circuits being responsive to the second transition of the input clock signal to propagate the output signals generated by the second delay circuits to a final second delay circuit that is coupled to the initial first delay circuit, the final second delay circuit generating a first clock signal at its output;

a plurality of third delay circuits coupled in series with each other from an initial third delay circuit to a final third delay circuit, each of the third delay circuits providing a third delay to a signal applied to its input that is a compliment of the input clock signal, the third delay circuits being responsive to the second transition of the input clock signal to propagate a signal through the third delay circuits from the initial third delay circuit toward the final third delay circuit;

a plurality of fourth delay circuits coupled in series with each other, each of the fourth delay circuits being coupled to a respective one of the third delay circuits in reverse order so that signals are coupled through the fourth delay circuits in a direction that is opposite the direction through which signals are coupled through the third delay circuits, each of the fourth delay circuits providing a fourth delay to a signal applied to its input that is the predetermined percent of the third delay, each of the fourth delay circuits generating an output signal that substantially mirrors an output signal from the respective third delay circuit at the first transition of the input clock signal, the fourth delay circuits being responsive to the first transition of the input clock signal to propagate the output signals generated by the fourth delay circuits to a final fourth delay circuit that is coupled to the initial third delay circuit, the final fourth delay circuit generating a second clock signal at its output; and a logic circuit coupled to receive the first clock signal from the output of the final second delay circuit and the second clock signal from the output of the final fourth delay circuit, the logic circuit being operable to combine the first and second clock signals to generate the output clock signal, the logic circuit comprising:

a first flip-flop having an input coupled to the second final second delay circuit;

a second flip-flop having an input coupled to the fourth final delay circuit; and a logic gate having a first input coupled to an output of the first flip-flop and a second input coupled to an output of the second flip-flop.

9. The clock doubler circuit of claim 8 wherein the outputs of the first delay circuits are set to a first logic level responsive to one logic level of the input clock signal, wherein the outputs of the third delay circuits are set to the first logic level responsive to another logic level of the input clock signal that is different from the one logic level, wherein a second logic level propagates through the first delay circuits responsive to the another logic level of the input clock signal, and wherein the second logic level propagates through the third delay circuits responsive to the one logic level of the input clock signal.

10. The clock doubler circuit of claim 8 wherein the predetermined percent comprises 50 percent.

11. The clock doubler circuit of claim 8, further comprising:

a plurality of fifth delay circuits coupled in series with each other, each of the fifth delay circuits being coupled to a respective one of the first delay circuits in reverse order so that signals are coupled through the fifth delay circuits in a direction that is opposite the direction through which signals are coupled through the first delay circuits, each of the fifth delay circuits providing a fifth delay to a signal applied to its input that is substantially the same as the first delay, each of the fifth delay circuits generating an output signal that substantially mirrors an output signal from the respective first delay circuit at the second transition of the input clock signal, the fifth delay circuits being responsive to the second transition of the input clock signal to propagate the output signals generated by the fifth delay circuits to a final fifth delay circuit that is coupled to the initial first delay circuit, a third output clock signal being generated by the final fifth delay, the third output clock signal being coupled to an input of the second flip-flop; and a plurality of sixth delay circuits coupled in series with each other, each of the sixth delay circuits being coupled to a respective one of the third delay circuits in reverse order so that signals are coupled through the sixth delay circuits in a direction that is opposite the direction through which signals are coupled through the third delay circuits, each of the sixth delay circuits providing a sixth delay to a signal applied to its input that is substantially the same as the third delay, each of the sixth delay circuits generating an output signal that substantially mirrors an output signal from the respective sixth delay circuit at the first transition of the input clock signal, the sixth delay circuits being responsive to the first transition of the input clock signal to propagate the output signals generated by the sixth delay circuits to a final sixth delay circuit that is coupled to the initial third delay circuit, a fourth output clock signal being generated by the final sixth delay circuit, the fourth output clock signal being coupled to an input of the first flip-flop.

12. The clock doubler circuit of claim 8 wherein the third delay is equal to the first delay.

13. A memory device, comprising:
a row address circuit operable to receive and decode row address signals applied to external address terminals of the memory device;
a column address circuit operable to receive and decode column address signals applied to the external address terminals;
a memory cell array operable to store data written to the array at a location determined by the decoded row address signals and the decoded column address signals;
a read data path circuit operable to couple read data signals from each of the arrays to external data terminals of the memory device, the read data path circuit being operable to apply the read data signals to the external data terminals responsive to a read data strobe signal;
a write data path circuit operable to couple write data signals from the external data terminals of the memory device and to couple the write data signals to one of the arrays;
a command decoder operable to decode a plurality of command signals applied to respective external command terminals of the memory device, the command decoder being operable to generate control signals corresponding to the decoded command signals; and
a signal generator operable to generate the write data strobe signal, the signal generator comprising:
a plurality of first delay circuits coupled in series with each other from an initial first delay circuit that is coupled to receive an input clock signal to a final first delay circuit, each of the first delay circuits providing a first delay to a signal applied to its input, the first delay circuits being responsive to a first transition of the input clock signal to propagate a signal through the first delay circuits from the initial first delay circuit toward the final first delay circuit; and
a plurality of second delay circuits coupled in series with each other, each of the second delay circuits being coupled to a respective one of the first delay circuits in reverse order so that signals are coupled through the second delay circuits in a direction that is opposite the direction through which signals are coupled through the first delay circuits, each of the second delay circuits providing a second delay to a signal applied to its input that is approximately half the delay of the first delay, each of the second delay circuits generating an output signal that substantially mirrors an output signal from the respective first delay circuit at a second transition of the input clock signal, the second delay circuits being responsive to the second transition of the input clock signal to propagate the output signals generated by the second delay circuits to a final second delay circuit that is coupled to the initial first delay circuit, the write data strobe signal being generated by the final second delay circuit; and
a plurality of third delay circuits coupled in series with each other, each of the third delay circuits being coupled to a respective one of the first delay circuits in reverse order so that signals are coupled through the third delay circuits in a direction that is opposite the direction through which signals are coupled through the first delay circuits, each of the third delay circuits providing a third delay to a signal applied to its input that is substantially the same as the first delay, each of the third delay circuits generating an output signal that substantially mirrors an output signal from the respective first delay circuit at the second transition of the input clock signal, the third delay circuits being responsive to the second transition of the input clock signal to propagate the output signals generated by the third delay circuits to a final third delay circuit that is coupled to the initial first delay circuit, the read data strobe signal being generated by the final third delay circuit.

14. The memory device of claim 13 wherein the outputs of the first delay circuits are set to a first logic level responsive to one logic level of the input clock signal, and wherein a second logic level propagates through the first delay circuits responsive to another logic level of the input clock signal.

15. The memory device of claim 13 wherein the signal generator further comprises:
a plurality of fourth delay circuits coupled in series with each other, each of the fourth delay circuits being coupled to a respective one of the third delay circuits in reverse order so that signals are coupled through the fourth delay circuits in a direction that is opposite the direction through which signals are coupled through the third delay circuits, each of the fourth delay circuits providing a fourth delay to a signal applied to its input that is approximately half the delay of the third delay, each of the fourth delay circuits generating an output signal that substantially mirrors an output signal from the respective third delay circuit at the first transition of the input clock signal, the fourth delay circuits being responsive to the first transition of the input clock signal to propagate the output signals generated by the fourth delay circuits to a final fourth delay circuit that is coupled to the initial third delay circuit, a second write data strobe signal being generated by final fourth delay circuit.

16. The memory device of claim 13 wherein the a memory cell array comprises a dynamic random access memory array.

17. The memory device of claim 13 wherein the third delay is equal to the first delay.

18. A system for generating an output clock signal that has a predetermined phase relative to an input clock signal, comprising:
a plurality of first delay circuits coupled in series with each other from an initial first delay circuit that is coupled to receive the input clock signal to a final first delay circuit, each of the first delay circuits providing a first delay to a signal applied to its input, the first delay circuits being responsive to a first transition of the input clock signal to propagate a signal through the first delay circuits from the initial first delay circuit toward the final first delay circuit;
a plurality of second delay circuits coupled in series with each other, each of the second delay circuits being coupled to a respective one of the first delay circuits in reverse order so that signals are coupled through the second delay circuits in a direction that is opposite the direction through which signals are coupled through the first delay circuits, each of the second delay circuits providing a second delay to a signal applied to its input that is a predetermined percent of the first delay, each of the second delay circuits generating an output signal that substantially mirrors an output signal from the respective first delay circuit at a second transition of the input clock signal, the second delay circuits being responsive to the second transition of the input clock signal to propagate the output signals generated by the second delay circuits to a final second delay circuit that is coupled to the initial first delay circuit, the output clock signal being generated by the final second delay circuit; and a plurality of third delay circuits coupled in series with each other, each of the third delay circuits being coupled to a respective one of the first delay circuits in reverse order so that signals are coupled through the third delay circuits in a direction that is opposite the direction through which signals are coupled through the first delay circuits, each of the third delay circuits providing a third delay to a signal applied to its input that is substantially the same as the first delay, each of the third delay circuits generating an output signal that substantially mirrors an output signal from the respective first delay circuit at the second transition of the input clock signal, the third delay circuits being responsive to the, second transition of the input clock signal to propagate the output signals generated by the third delay circuits to a final third delay circuit that is coupled to the initial first delay circuit, a second output clock signal being generated by the final third delay circuit.

19. The system of claim 18 wherein the predetermined percent comprises 50 percent.

20. A modified synchronized mirror delay circuit, comprising:

a plurality of first delay circuits coupled in series with each other, each of the first delay circuits having a first delay;

a plurality of second delay circuits coupled in series with each other, each of the second delay circuits being coupled to a respective one of the first delay circuits in a manner of a synchronized mirror delay, each of the second delay circuits having a second delay that is a predetermined percent of the first delay; and a plurality of third delay circuits coupled in series with each other, each of the third delay circuits being coupled to a respective one of the first delay circuits in the manner of a synchronized mirror delay, each of the second delay circuits having a third delay that is substantially equal to the first delay.

21. The modified synchronized mirror delay circuit of claim 20 wherein the predetermined percent comprises 50 percent.

22. A clock doubler circuit that generates an output clock signal that has twice the frequency of an input clock signal, comprising:

a plurality of first delay circuits coupled in series with each other from an initial first delay circuit that is coupled to receive the input clock signal to a final first delay circuit, each of the first delay circuits providing a first delay to a signal applied to its input, the first delay circuits being responsive to a first transition of the input clock signal to propagate a signal through the first delay circuits from the initial first delay circuit toward the final first delay circuit; and a plurality of second delay circuits coupled in series with each other, each of the second delay circuits being coupled to a respective one of the first delay circuits in reverse order so that signals are coupled through the second delay circuits in a direction that is opposite the direction through which signals are coupled through the first delay circuits, each of the second delay circuits providing a second delay to a signal applied to its input that is a predetermined percent of the first delay, each of the second delay circuits generating an output signal that substantially mirrors an output signal from the respective first delay circuit at a second transition of the input clock signal, the second delay circuits being responsive to the second transition of the input clock signal to propagate the output signals generated by the second delay circuits to a final second delay circuit that is coupled to the initial first delay circuit, the final second delay circuit generating a first clock signal at its output;

a plurality of third delay circuits coupled in series with each other from an initial third delay circuit to a final third delay circuit, each of the third delay circuits providing a third delay to a signal applied to its input that is a compliment of the input clock signal, the third delay circuits being responsive to the second transition of the input clock signal to propagate a signal through the third delay circuits from the initial third delay circuit toward the final third delay circuit;

a plurality of fourth delay circuits coupled in series with each other, each of the fourth delay circuits being coupled to a respective one of the third delay circuits in reverse order so that signals are coupled through the fourth delay circuits in a direction that is opposite the direction through which signals are coupled through the third delay circuits, each of the fourth delay circuits providing a fourth delay to a signal applied to its input that is the predetermined percent of the third delay, each of the fourth delay circuits generating an output signal that substantially mirrors an output signal from the respective third delay circuit at the first transition of the input clock signal, the fourth delay circuits being responsive to the first transition of the input clock signal to propagate the output signals generated by the fourth delay circuits to a final fourth delay circuit that is coupled to the initial third delay circuit, the final fourth delay circuit generating a second clock signal at its output;

a plurality of fifth delay circuits coupled in series with each other, each of the fifth delay circuits being coupled to a respective one of the first delay circuits in reverse order so that signals are coupled through the fifth delay circuits in a direction that is opposite the direction through which signals are coupled through the first delay circuits, each of the fifth delay circuits providing a fifth delay to a signal applied to its input that is substantially the same as the first delay, each of the fifth delay circuits generating an output signal that substantially mirrors an output signal from the respective first delay circuit at the second transition of the input clock signal, the fifth delay circuits being responsive to the second transition of the input clock signal to propagate the output signals generated by the fifth delay circuits to a final fifth delay circuit that is coupled to the initial first delay circuit, a third output clock signal being generated by the final fifth delay, the third output clock signal being coupled to an input of the second flip-flop;

a plurality of sixth delay circuits coupled in series with each other, each of the sixth delay circuits being coupled to a respective one of the third delay circuits in reverse order so that signals are coupled through the sixth delay circuits in a direction that is opposite the direction through which signals are coupled through the third delay circuits, each of the sixth delay circuits providing a sixth delay to a signal applied to its input that is substantially the same as the third delay, each of the sixth delay circuits generating an output signal that substantially mirrors an output signal from the respective sixth delay circuit at the first transition of the input clock signal, the sixth delay circuits being responsive to the first transition of the input clock signal to propagate the output signals generated by the sixth delay circuits to a final sixth delay circuit that is coupled to the initial third delay circuit, a fourth output clock signal being generated by the final sixth delay circuit, the fourth output clock signal being coupled to an input of the first flip-flop; and a logic circuit coupled to receive the first clock signal from the output of the final second delay circuit and the second clock signal from the output of the final fourth delay circuit, the logic circuit being operable to combine the first and second clock signals to generate the output clock signal.

23. The clock doubler circuit of claim 22 wherein the logic circuit comprises:

a first flip-flop having an input coupled to the second final second delay circuit;

a second flip-flop having an input coupled to the fourth final delay circuit; and an logic gate having a first input coupled to an output of the first flip-flop and a second input coupled to an output of the second flip-flop.

24. The clock doubler circuit of claim 22 wherein the outputs of the first delay circuits are set to a first logic level responsive to one logic level of the input clock signal, wherein the outputs of the third delay circuits are set to the first logic level responsive to another logic level of the input clock signal that is different from the one logic level, wherein a second logic level propagates through the first delay circuits responsive to the another logic level of the input clock signal, and wherein the second logic level propagates through the third delay circuits responsive to the one logic level of the input clock signal.

25. The clock doubler circuit of claim 22 wherein the predetermined percent comprises 50 percent.

26. The clock doubler circuit of claim 22 wherein the third delay is equal to the first delay.

* * * * *